(12) United States Patent
Kewitsch et al.

(10) Patent No.: US 7,848,370 B2
(45) Date of Patent: Dec. 7, 2010

(54) ELECTRONICALLY PHASE-LOCKED LASER SYSTEMS

(75) Inventors: Anthony S. Kewitsch, Santa Monica, CA (US); George A. Rakuljic, Santa Monica, CA (US)

(73) Assignee: Telaris Inc., Santa Monica, CA (US)

( * ) Notice: Subject to any disclaimer, the term of this patent is extended or adjusted under 35 U.S.C. 154(b) by 370 days.

(21) Appl. No.: 12/020,424

(22) Filed: Jan. 25, 2008

(65) Prior Publication Data

US 2009/0296751 A1    Dec. 3, 2009

Related U.S. Application Data

(60) Provisional application No. 60/897,742, filed on Jan. 26, 2007.

(51) Int. Cl.
*H01S 3/13* (2006.01)

(52) U.S. Cl. .............................. 372/29.011; 372/38.01; 372/23; 372/29.023; 372/50.21; 372/50.22

(58) Field of Classification Search ............. 372/29.011, 372/29.023, 23, 38.01, 50.21
See application file for complete search history.

(56) References Cited

U.S. PATENT DOCUMENTS

2005/0219552 A1 * 10/2005 Ackerman et al. .......... 356/603
2006/0239312 A1 * 10/2006 Kewitsch et al. ....... 372/29.023

* cited by examiner

*Primary Examiner*—Dung T Nguyen
(74) *Attorney, Agent, or Firm*—Jones, Tullar & Cooper, P.C.

(57) ABSTRACT

Semiconductor diode lasers are phase-locked by direct current injection and combined to form a single coherent output beam. The optical power is amplified by use of fiber amplifiers. Electronically control of the optical phases of each emitter enables power efficient combining of output beams to be maintained under dynamic conditions.

7 Claims, 9 Drawing Sheets

ELECTRONICALLY PHASE-LOCKED LASER SYSTEMS

REFERENCE TO RELATED APPLICATIONS

This application relies for priority on provisional application 60/897,742, filed on Jan. 26, 2007 and entitled "Electronically phase-locked high power laser utilizing semiconductor laser elements".

FIELD OF THE INVENTION

This invention relates to semiconductor laser systems; in particular, to laser systems comprised of semiconductor laser diodes that are electronically phase-locked to an optical reference.

BACKGROUND OF THE INVENTION

Techniques to control the amplitude and phase of semiconductor laser diodes promise to extend the performance of laser diode systems and thereby enable a wide range of new applications. Presently, semiconductor lasers exhibit several favorable attributes, including low cost, small size and high electrical efficiency, which have made them key elements in communications systems and high power laser systems (e.g., for pumping fiber lasers). One limitation of the latter application, however, is that as the optical power of semiconductor diode lasers and fiber lasers increases, several factors begin to degrade the spectral and spatial quality of the optical output beam. For example, thermal non-uniformities such as filamentation produce spatially and spectrally multi-moded outputs with poor beam quality for semiconductor diode lasers above ~1 Watt. In optical fiber-based systems, optical nonlinearities such as stimulated Brillioun scattering (SBS) lead to spectral broadening and dynamic instabilities for power levels ~1 kW. Each of these factors can seriously degrade the optical performance of typical implementations of a high power laser. Therefore, for applications requiring near-diffraction limited beams with good focusability and low divergence, it challenging to exploit the advantages of diode laser-based systems and scale their power beyond 1 KW.

Much progress has been made in the development of Ytterbium (Yb), Erbium (Er) and Prasedymium (Pr)-doped fiber lasers and amplifiers utilizing semiconductor diode lasers. These semiconductor pump diodes are fiber coupled to a large diameter multimode core, co-linear with a single mode doped core in which a lasing mode or amplified seed signal propagates. The multimode pump power spatially overlaps and is absorbed within the central, single mode core, such that pump energy at a wavelength of 900 nm to 975 nm for Yb fiber amplifiers is efficiently transferred (>80%) to a single optical mode within the 1055 nm to 1075 nm spectral range. Since the optical radiation is confined within the single mode waveguide core, the optical intensities are very high and can produce optical non-linearities. The intensity can readily exceed the stimulated Brillioun scattering (SBS) threshold, which is typically about 10 W for 10 meters of single mode, polarization-maintaining (PM) fiber with a 6-micron core diameter at 1064 nm. Above this threshold, several negative factors conspire to degrade or limit laser performance. Primarily, the optical spectrum broadens and significant light is coupled into the frequency-shifted, SBS backscattered light.

In the prior art, the degradation of the laser's spectral and spatial modes are avoided by maintaining power levels below about a few 100's of W for large mode area, single mode PM fiber amplifiers and/or lasers. This is accomplished by increasing the central core diameter and by decreasing the numerical aperture by a compensating amount to remain single mode or near-single mode. Introducing index of refraction non-uniformities along the length of active fiber, by way of longitudinal temperature and/or strain gradients, for example, mitigates SBS effects.

To scale to high power levels, it is desirable to combine the outputs of multiple, intermediate power fiber amplifiers or fiber lasers. To accomplish this, a single "master" fiber laser is split into a number of branches which seed a corresponding number of phase modulators and fiber amplifiers. U.S. Pat. No. 5,946,130 by Rice discloses an array of optical fiber amplifiers seeded by a common master laser whose output is power split, amplified, and coherently re-combined by use of phase shifters and control circuits to remove the uncorrelated phase errors introduced by the separated amplifier paths.

Betin et al. have disclosed an alternate approach to coherent combining of fiber amplifiers in U.S. Patent Application US2006/0078033A1. In this application, physically separate but optically coupled fiber lasers are forced to lase at the same frequency by optically injection-locking each fiber laser with the optical outputs of other fiber lasers.

Other techniques to combine the multiple coherent outputs into a single diffraction limited optical beam have been disclosed. U.S. Pat. No. 5,307,369 by Kimberlin describes the use of optical beam splitting plates to coherently combine the outputs of a plurality of laser. U.S. Pat. No. 4,813,762 by Leger et al. describes the use of diffractive lenslet arrays within a laser array cavity to aperture fill and coherently combine the outputs. U.S. Patent Application 2007/0086010 by Rothenberg describes a technique for interferometric beam combining of multiple beams into a single composite output beam.

In our previously filed patent application US2006/239312A1, we have disclosed two-dimensional semiconductor laser arrays which are individually driven by electronic phase-locked loops, wherein the loop controller locks the frequency and phase of each high power laser element to the same reference laser by way of a low delay electronic feedback path. Two lasers which are locked thereby exhibit a high degree of mutual coherence and can be coherently combined. This approach can produce a single frequency, single spatial mode output beam of high quality with high electrical efficiency.

An important aspect of future high power laser systems is their ability to scale to optical powers in excess of 10's of KW. This scalability is impacted, for example, by design tradeoffs resulting from heat extraction requirements as well as optical nonlinearities and non-idealities. Practical issues such as alignment tolerances, reliability, electrical efficiency, cost, size and weight are also key factors influencing the successful realization of high power laser systems. Techniques to extend the performance of laser systems from a power and also linewidth point of view are necessary. A key aspect of such applications is the need to control the coherence and noise characteristics of semiconductor diode laser elements. The techniques to provide such control are based on optical phase-locked loops (OPLLs). High power laser systems are only one example of the many applications which benefit from advanced techniques to phase-lock semiconductor laser diodes.

SUMMARY OF THE INVENTION

This invention describes a system of independent, frequency-controlled semiconductor laser elements, such as one or more diode lasers that are electronically frequency and phase-locked to a common reference laser. Phase-locking enables the diode laser elements to be coherently combined with high-efficiency and is accomplished by current modulating the element, whereby the current modulation signal is generated by an optical phase-locked loop associated with each laser element. High speed electronic control of the drive current forces each independent laser element to track the instantaneous phase and frequency of the reference laser.

A multiplicity of phase-locked semiconductor lasers which seed single frequency fiber amplifiers and are under electronic phase-control enables the efficient combination of fiber-amplified outputs. Such electronic control of optical phase enables laser system scalability to high optical output power levels while providing high electrical efficiency, diffraction limited beam quality, wavefront control and potentially narrow spectral linewidth.

Furthermore, optical phase-locked loops based on the generation and locking of diode laser sidebands are disclosed. This technique provides a method of locking semiconductor lasers which otherwise would be unable to be locked. An application of sideband locking to electronic linewidth narrowing is disclosed.

DETAILED DESCRIPTION OF THE INVENTION

In a particular embodiment of this invention, we disclose opto-electronic systems to coherently combine a multiplicity of independent, high power lasers comprised of semiconductor diode laser elements which operate as current controlled oscillators (CCOs) within electronic phase-locked loops. An array of visible or infrared wavelength semiconductor diode lasers are electronically phase and frequency-locked to a common reference laser at the same nominal wavelength or to within a radio frequency (RF) offset (e.g., 1 GHz). The array of phase-locked diode lasers thereby produces an equivalent number of separate output beams characterized by substantially identical optical frequencies and phases. Such separate output beams may be separately amplified by single mode, single frequency, single polarization fiber amplifiers to a level of 10's to 1000's of Watts per separate output beam path. Output beams are combined by downstream optics comprised of optical beamsplitters, each of which includes two inputs as well as sum and difference outputs. Associated with each difference output is a photodetector responsive to the steady-state low frequency phase error between beam pairs directed into the two beamsplitter inputs. The photodetectors produce electrical signals that are transformed by the phase-locked-loop (PLL) circuit into diode laser frequency control signals. The signals possess temporal characteristics required to modulate and control the optical phase of each diode laser, such that coherent summation of optical power is achieved at each sum output of the multiplicity of beamsplitters.

Figure 1:
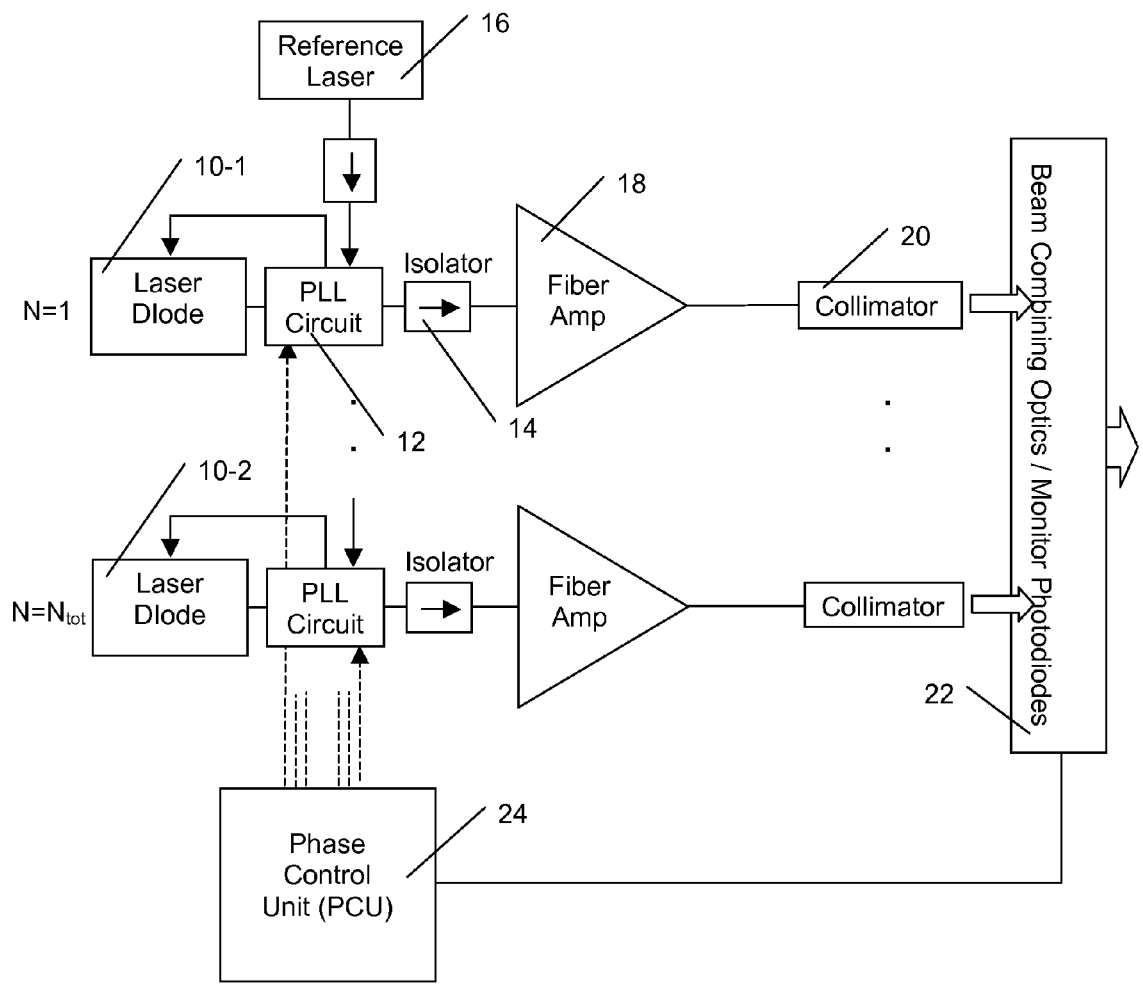
FIG. 1 illustrates the electronically phase-locked, coherently combined laser system in accordance with the invention.

In a first example (FIG. 1), an array of eight high power (0.1-10 W) semiconductor diode lasers at 1064 nm are each electronically phase and frequency-locked with a 1 GHz frequency offset to a common reference laser at 1064 nm. A single mode, single frequency, single polarization Yb-fiber amplifier providing up to 1 KW of optical power may separately amplify each high power semiconductor laser. The semiconductor diode lasers 10 seed the multiplicity of fiber amplifiers 18 attached thereto by direct optical fiber connection.

The majority of the laser diode 10 output power is launched through an isolator 14 into a Yb fiber amplifier 18 comprised of 1 to 50 meters of polarization maintaining (PM), Ytterbium-doped fiber with a large single mode core, typically 20-30 microns in diameter. The doped fiber is cladding-pumped by multiple high-power pump diodes (single emitters, bars or two dimensional arrays) at 975 nm, coupled to the doped fiber secondary core by fused tapered fiber bundles functioning as pump combiners. A typical pump combiner efficiently couples two to twenty multimode pump lasers into the secondary core. To produce 150 W output power per amplifier, about 300 W of pump power is required. Pump diodes provide a dc, high brightness light source and are physically and functionally distinct from the phase-locked seed lasers.

The multiple independent, yet coherent, laser outputs are launched into free space by collimators 20 comprised of a subassembly including optical fiber, a protective end cap and a collimating lens. The nominally pure silica rod end-cap spliced to the amplifier's single mode PM fiber output allows the high power optical beam to freely diffract in a non-guided fashion from the waveguide core. The length of the end cap is sufficiently long so that the optical intensity at the polished exit face is reduced below the damage threshold of the silica rod.

High gain power amplifiers 18 are sensitive to the optical feedback associated with backreflections, which can produce parasitic lasing, oscillations and catastrophic damage. As a consequence, an optical isolator capable of withstanding high power is typically placed within the output beam path, downstream of the power amplifier.

Figure 2:
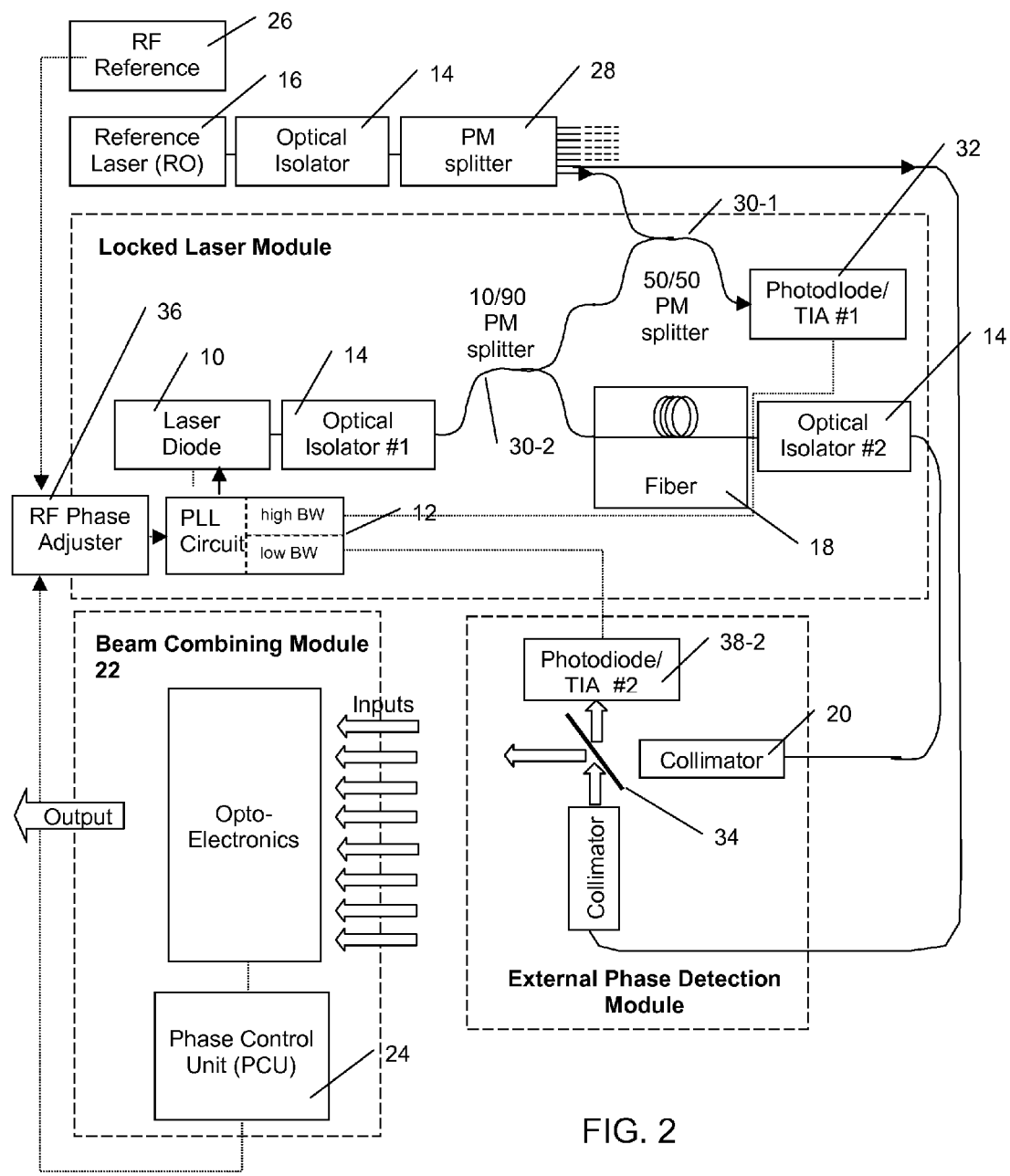
FIG. 2 illustrates a block diagram detailing an individual, phase-locked laser module, external phase control module and beam combining module.

FIG. 2 details a further example detailing an individual optical phase-locked loop (OPLL) and high power laser element including electronic control and optical coupling elements. In this embodiment, a GaAs laser diode emitting 10-1000 mW at 1064 nm is coupled to single mode, polarization maintaining fiber. The laser diode 10-1 exhibits a spectral linewidth of <10 MHz (potentially <100 KHz for external cavity diode laser configurations). Single frequency laser operation is achieved by use of an internal distributed feedback (DFB) grating, distributed Bragg reflector (DBR) grating, external fiber Bragg grating or external surface diffraction grating.

Figure 6:
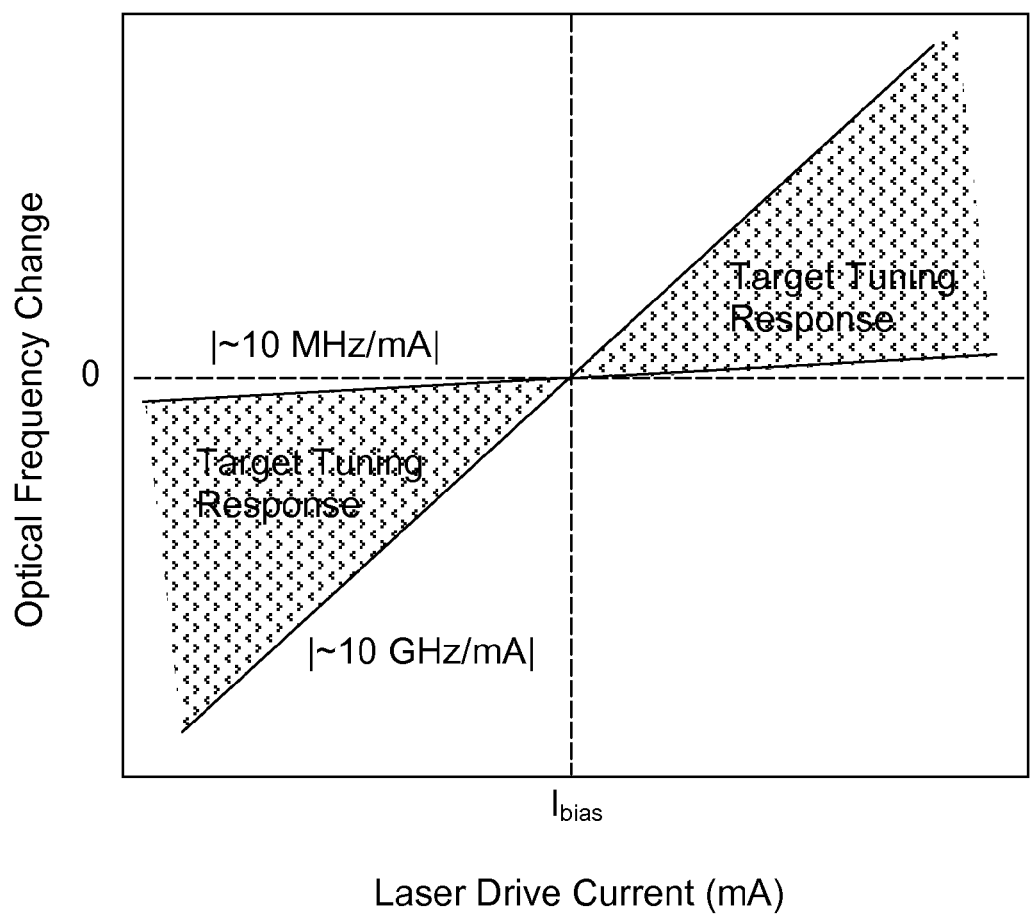
FIG. 6 plots the typical frequency modulation response required to phase-lock semiconductor lasers.

A portion of the optical signal coupled by laser 10-1 into an optical fiber is tapped-off by a 1/99 polarization maintaining splitter 30-2. The tap output is mixed with a portion of the reference laser 16 output by use of a 50/50 polarization maintaining beam splitter 30-1 coupled to a high speed photodiode/transimpedance amplifier (TIA) #1 (32-1). Connections between fiber optic transmission elements are achieved by low loss fusion splicing, for example. The RF voltage output of the TIA is input to electronic PLL 12, which injects an RF modulation current to the laser diode 10-1 semiconductor gain section to modulate the optical frequency in a manner which closely tracks the frequency and phase of the reference laser 16. FIG. 6 illustrates the typical range of tuning responses for semiconductor diode lasers as a function of their gain section drive current.

To frequency and phase-lock the diode laser 10 to the reference laser 16 with low rms phase error, the phase-locked loop 12 requires a bandwidth in excess of about ten times the full width half maximum beat note width. Typical beat note widths are 100 kHz to 10 MHz. Note that a circuit bandwidth of 50 MHz requires that the time delay through the feedback loop be less than about 5 ns, corresponding to a length limitation of approximately 1.7 meters for typical optical and electronic transmission lines. Therefore, the high speed photodiode associated with OPLL is placed before the optical amplifier 18 because the substantial length of fiber (typically 10 to 50 meters) within the amplifier 18 would otherwise limit the available electronic bandwidth.

The outputs 48 of each high power fiber amplifier 18 are coupled to collimators 20 comprised of one of more lenses precisely aligned relative to the core of the optical fiber and producing a collimated beam typically 1 to 5 mm in diameter. The multiple collimated output beams must be aperture-filled or beam combined to form a single, near-diffraction limited output beam 50. A near diffraction-limited beam typically exhibits a beam quality ($M^2$ factor) in the range of 1.0 to 1.5.

The fiber amplifier's contribution to phase noise is detected by tapping-off a small fraction of the output power (<0.1%) after the amplifier and beating it with the same reference laser 16 on photodetector #2 (38-2). The output of photodetector/TIA #2 38-2 is also input to the electronic PLL circuit, which applies a correction signal to the laser diode 10-1 such that the amplifier's low frequency noise is cancelled at the amplifier's output. The external phase detection module 50 in FIG. 2 performs this functionality.

Because of the substantial length of optical fiber within the fiber amplifier 18 and its attendant time delay, the electronic feedback loop derived from the detected signal downstream of the amplifier must be bandwidth limited (<10 MHz) to maintain dynamic stability of the control system. Fortunately, a fiber amplifier designed to mitigate SBS and microphonics contributes phase noise only over a limited bandwidth of <1-10 KHz.

Dynamic phase perturbations introduced by air currents or temperature gradients across the separate beam paths are also compensated for or canceled-out by active electronic control. The relative phases of the amplified laser elements are measured by photodetectors and are electronically controlled by driving RF phase shifters or RF voltage controlled oscillators (i.e., phase adjusting elements) 36 at the input to each PLL circuit 12. Suitable electronic control means maintain constructive rather than destructive interference of each laser beam pair as they are sequentially combined in a pair wise fashion. The beam combining module 22 in FIG. 2 performs the determination and setting of proper phase values.

Figure 3:
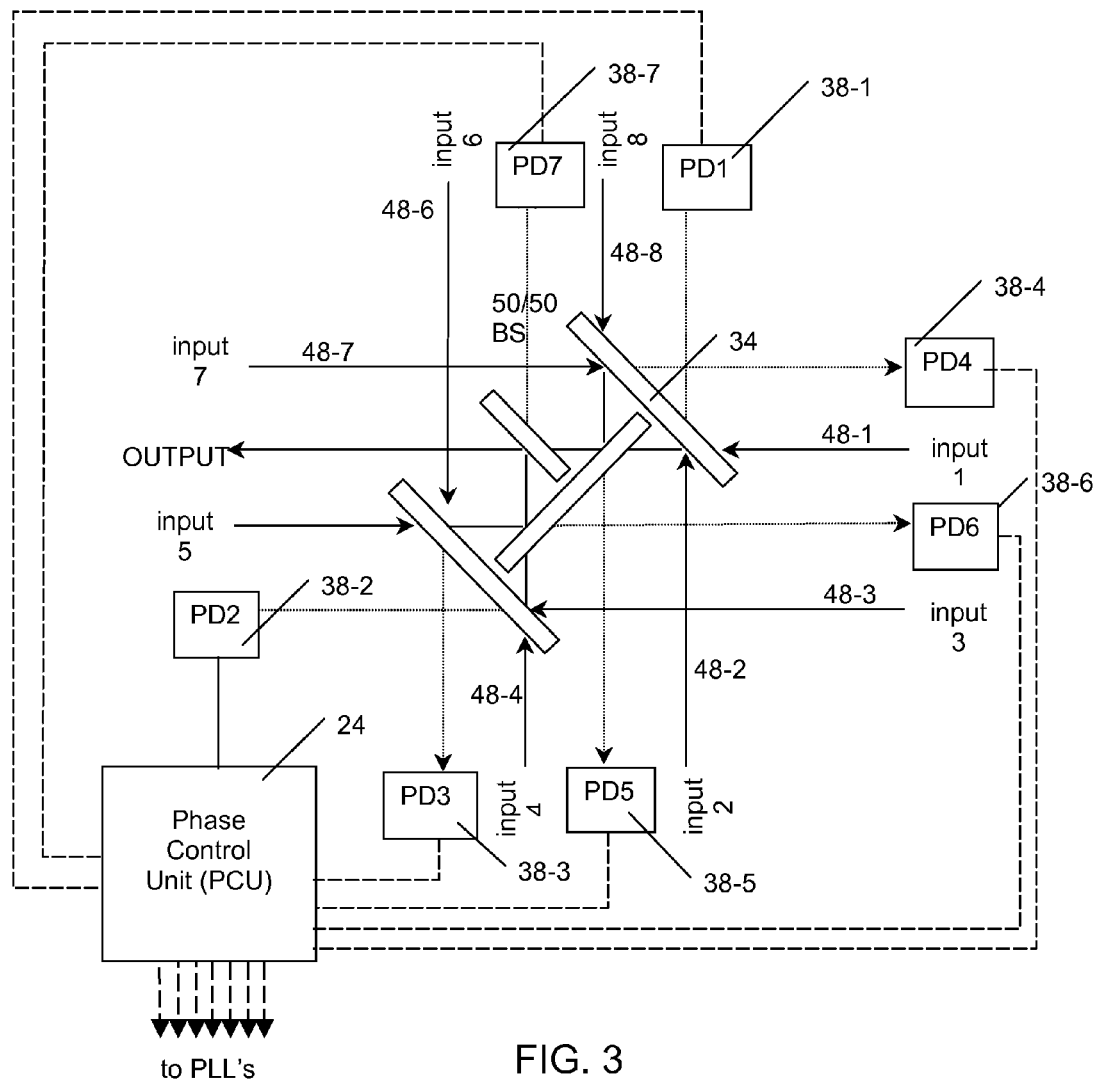
FIG. 3 illustrates a free space coherent beam combining subsystem using binary tree of 50/50 beamsplitters with photodiodes.

In a particular example, the beam combining module 22 coherently combines N=eight beams 48 propagating in free space (rather than in fiber) using a binary tree arrangement of 50/50 beamsplitter plates 34, as illustrated in FIG. 3. The beams at this point are of high optical power beyond the transmission capabilities of typical single mode optical fiber.

This hierarchical-tree or parallel approach provides favorable scaling characteristics for combining beams numbering in powers of 2. Beams are combined pair wise in a sequential fashion and thereby pass through a minimum of optical elements ($Log_2[N]$, where N is the number of beams).

The conditions for constructive interference of eight frequency-locked laser outputs 48 is established by electronic control derived from the optical powers measured by relatively low bandwidth (<1 MHz) monitor photodiodes 38 which sample the nulled outputs of the beamsplitters 34. Each photodiode 38 measures the optical power at the null port of a particular beamsplitter combining two independent beams. When phase locked, the two independent beams are mutually coherent and interfere with one another. The photodiode 38 detects the intensity fluctuations associated with the interference dynamics, also a measure of the phase fluctuations. The relative phases of the two beams are electronically set such that the two beams maintain destructive interference at the null port.

The electronic control therefore generates electronic correction signals to alter the optical phases of each laser 10 and produce pair wise addition of power throughout the arrangement of beam splitters. This is implemented by driving the RF phase adjuster 36 with the control signal. The phase adjuster 36 may be an RF phase shifter that alters the phase of the RF reference signal 26 supplied as the offset frequency input to each PLL 12. In an alternate example, the control signal drives a phase adjuster 36 comprised of an RF voltage controlled oscillator (VCO) operating the nominal RF reference offset frequency and serving as the loop's RF reference. This RF reference signal 26 down-converts the 0.5 to 5 GHz optical beat signal to the baseband by use of an electronic mixer within the phase-locked loop circuit 12. A change in the electronic RF phase is transferred identically to a change in relative optical phase between the particular laser module 10 and the reference laser 16, thereby allowing electronic programmability of the relative optical phase.

In particular, the electronic feedback processing is implemented within the phase control unit (PCU) 24, which continuously and rapidly (~every microsecond) updates the laser 10 phase settings during the operation of the laser system to maintain the desired phase relationships between the downstream output beams. The PCU changes the phase of each diode laser element 10 by electronic control means through the RF phase adjuster 36, either the RF phase shifter or electronic voltage controlled oscillator (VCO) as described above.

The RF phase adjuster 36 changes the phase and/or frequency of the RF reference signal serving as the RF offset for the phase-locked loop circuit. By changing the control voltage applied to the RF phase adjuster, a variable amount of delay is produced to shift the RF phase over a range of 360 degrees or more. The electronic VCO has the advantage of providing infinite phase dynamic range and avoiding the potential for ~360 degree phase resets which would result from a phase shifter implementation. Typical RF phase shifters provide only a few cycles of phase adjustment, which is generally inadequate to track the laser's substantial phase excursions during the initial turn-on and non-equilibrium temperature of the system In a particular example, a sequential, digital control process is implemented to ensure that all eight laser beams are set with correct relative phases to achieve a maximum beam combining efficiency. First, the following steps are performed in parallel and on a pair wise basis by means of electronic feedback: the relative phases of lasers 1 (10-1) and 2 (10-2) are adjusted to minimize the power on PD1 32-1, the relative phases of lasers 3 (10-3) and 4 (10-4) are adjusted to minimize the power on PD2 (32-2), the relative phases of lasers 5 (10-5) and 6 (10-6) are adjusted to minimize the power on PD3 (32-3), the relative phases of lasers 7 (10-7) and 8 (10-8) are adjusted to minimize the power on PD4 (32-4). Subsequently, the following steps are performed in parallel: the power on PD5 (32-5) is minimized by varying the phases of laser 1 and laser 2 without changing the relative phase between laser 1 and laser 2, and the power on PD6 is minimized by varying the phases of laser 3 and laser 4 without changing the relative phase between laser 3 and 4. Next, the power on PD7 is minimized by varying the phases of lasers 1, 2, 7, 8 while maintaining the relative phases between lasers 1, 2, 7, 8. This cycle is then repeated indefinitely for the duration of the laser's operation. The typical time per cycle is 1 microsecond to 100 ms.

Figure 4:
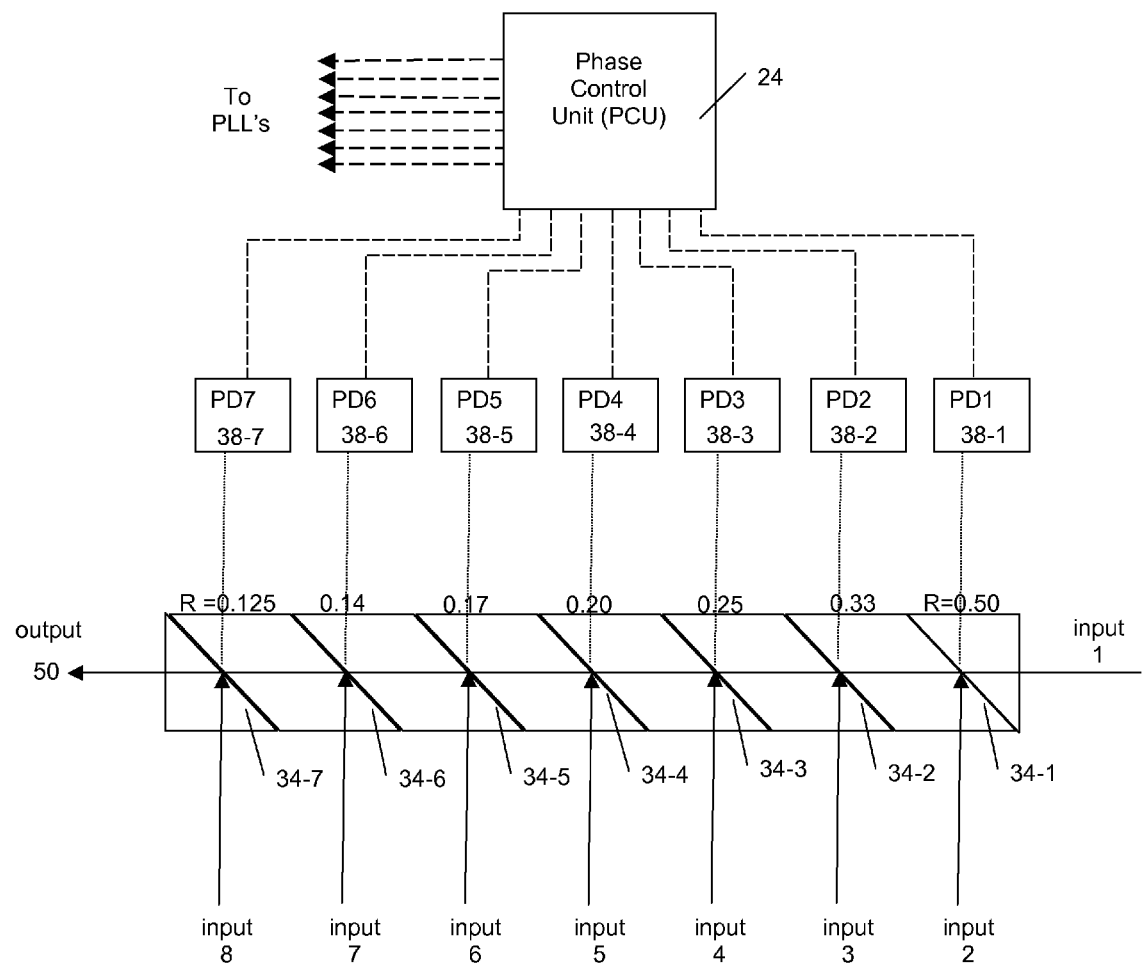
FIG. 4 illustrates a free space coherent beam combining subsystem using a series arrangement of different beamsplitters with photodiodes.

In an alternate example, a serial arrangement of beam splitters is utilized to combine an arbitrary number of high power laser outputs into a single coherent beam (FIG. 4). This figure illustrates a system of eight beams, but in general, this technique applies to any number of serially arranged beams. Seven beam splitter plates 34 arranged in series are adequate to combine eight equal intensity beams 48, each plate 34 with a different beam splitting ratio. The appropriate beam splitting ratio can be achieved by selecting the proper dielectric reflector coating on each plate 34, which can readily achieve reflectivity precision of 1 to 5% absolute. The nulled beam splitter outputs are directed to photodetectors 38-1, ... 38-7 whose electronic measurements of the interference between beam pairs are input to the phase control unit 24. The phase control unit 24 generates electronic correction signals, which set the phases of each laser 10 to ensure that the difference port of each beam splitter is adequately nulled. The result is efficient summation of power into the single, monochromatic, combined output beam 50.

Additional requirements to efficiently combine a multiplicity of independent, but mutually coherent beams include the need for substantially similar beam characteristics, namely, beam diameter D and divergence angle $\Delta\theta$. Furthermore, all beams must be directed onto a substantially collinear and spatially overlapping path. Each beam must be aligned to within $\Delta\theta/5$ in propagation direction and D/5 in transverse position to ensure adequate wavefront matching of individual beams.

Figure 5:
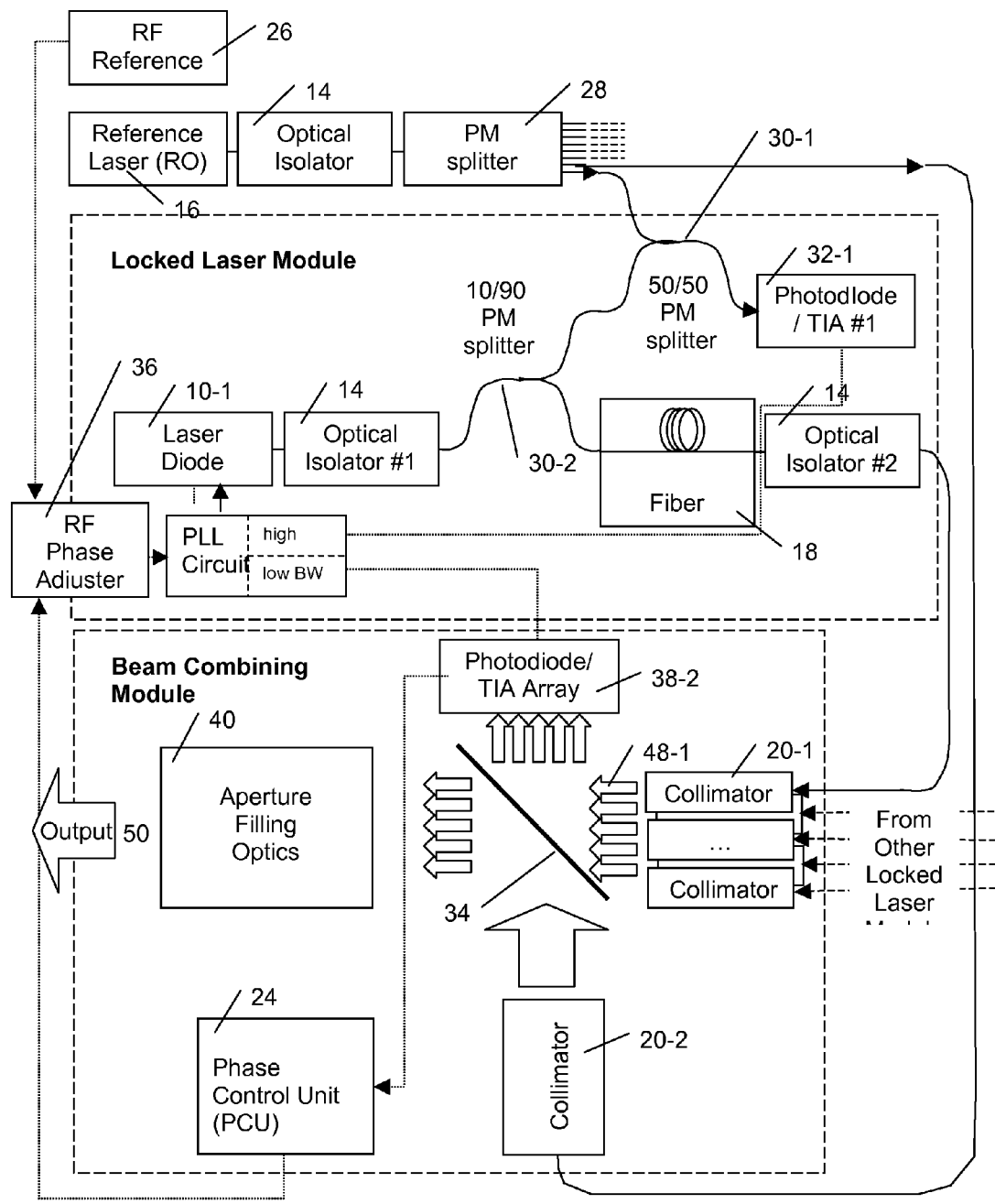
FIG. 5 illustrates a block diagram detailing an individual phase locked laser module and beam combining module.

The outputs of the laser modules 10 may also be combined by aperture filling, in which the composite beam is rectagonally or hexagonally tiled with beam elements. FIG. 5 illustrates such a system. The collimated outputs 20-1 of the amplifiers 18 are closely packed to launch a substantially aperture-filled beam into free space. The collimated output beams 48 are aligned with high parallelism to provide high combining efficiency with good beam quality. Each collimator 20 is mounted in a carrier providing precise alignment of tip-tilt angles and transverse positions. A portion of the combined output beam is picked-off by a beam splitter 34 and interfered with the reference laser beam 16 on an array of photodetectors 38-2. Each laser module 10 produces a unique beat signal on its associated photodetector within the array 38-2. This beat signal is processed by the phase control module 24 that determines the proper value to shift the RF reference phase input to each locked-loop. The optical phase of each locked laser module 10 is controlled by the RF phase adjuster 36, which is typically an electronic voltage controlled oscillator (VCO) or phase-shifter. This electronic feedback path cancels or compensates for the relative phase noise added by the fiber amplifiers, ensuring that the outputs of the collimators 20-1 have proper phase settings to produce a coherent and diffraction-limited phase front at the laser output with minimal loss of optical power.

The beam combining module in FIG. 5 further includes aperture filling optics 40 after the collimator array 20. Typically, the combined optical wavefront after the collimator array 20 includes substantial gaps between each beam element where the optical intensity is low. These gaps lead to undesirable diffraction in the far-field with significant amounts of power in the higher diffraction orders. To maximize the power in the central diffraction peak, micro-optic lens arrays enlarge the beams such that they overlap and phase plates remove residual amplitude and phase ripple. Alternately, a single focusing lens and diffractive beam combiner comprising the aperture filling optics 40 can be utilized to superpose each beam element 48 into a single, co-propagating output beam 50.

The use of phase-locked semiconductor diodes followed by fiber amplifiers offers several benefits; namely, an economy of components, more stable optical performance, increased reliability and higher electrical efficiency. By seeding amplifiers with phase-locked, high power diode lasers, very long and complex amplifiers with two to three preamplifier stages and one power amplifier stage can be replaced by a single stage power amplifier. This reduces the components count by about a factor of three. In addition, the reduced amplifier length mitigates fiber nonlinearities and optical noise pickup.

This coherently combined laser system exhibits additional characteristics that are superior to the prior art. The electrical efficiencies of semiconductor lasers exceed that of fiber preamplifiers, so the elimination of fiber preamplifiers by utilizing high power seed lasers will improve the overall laser system wall plug efficiency. The prior art as recited in U.S. Pat. No. 5,946,130 requires, in practice, the use of complex and inefficient multi-stage preamplifiers because a single high power master laser is power split into a large number of low power outputs. To amplify these outputs by 30 to 40 dB while preventing catastrophic (parasitic) lasing and retaining the low phase noise characteristics required for coherent combining, the amplifier must be separated into two to three preamplifier stages plus a final power amplifier stage. Each preamplifier stage typically generates in excess of 10 dB of gain and is independently diode pumped and isolated from one another by lossy, interstage optical isolators.

Typical multi-stage Yb-preamplifiers separated by isolators have a net electrical efficiency of only ~10% due to the insertion loss of the isolators and the reduced optical conversion efficiency at low pump powers. To provide large gain (>30-40 dB), the amplifier is partitioned into several (three to five) independent amplification stages in series, having saturated output powers of 100 mW, 1 W, 10 W, and 100 W, for example. To prevent undesirable oscillation and to prevent the growth of ASE noise, each stage is typically followed by an optical isolator and potentially by a narrowband optical notch filter. These components add as much as 1 dB loss per stage, reducing the gain per stage from 10 dB to 9 dB, for example.

In contrast to fiber preamplifiers, a single stage power amplifier displays more favorable operating characteristics. Namely, since it is strongly pumped it can be 30-40% efficient. Therefore, the approach disclosed in this invention eliminates multi-stage preamplifiers by using high power phase-locked laser diodes 10, improving efficiency and reducing the laser system's cost, weight, complexity, optical delay and susceptibility to microphonic noise-pickup.

The use of electronic locking of fiber coupled, high power, amplified semiconductor lasers extends across a broad range of wavelengths, power levels and implementations. In practice, the number of amplified laser elements N can extend to hundreds of parallel chains. It is conceivable that N electronically phase-locked semiconductor lasers seeding high power fiber amplifiers (1 KW) whose outputs are coherently combined will produce a diffraction limited beam with an optical power level of N KWs. N can be a large number in practice because the N semiconductor laser diodes/PLLs need only a small amount of reference laser power which is power split and distributed to each PLL (typically 100 uW to 1 mW).

Alternately, optical amplification may be performed by any combination of semiconductor amplifiers (SA), fiber amplifiers (FA) or other solid state optical amplifier approaches (Nd:YAG, Nd:YLF and Yb or other rare earth element doped bulk glass). For example, the semiconductor amplifiers may utilize electrically pumped GaAs or InGaAs materials and may be integrated with a laser diode seed, or may be a separate element.

In an alternate example, optical fiber amplifiers may utilize Er-doped fiber optically pumped at 980 nm or 1480 nm for emission in the 1530-1610 nm band, or Pr-doped fiber for emission in a window about 1310 nm. Alternately, slabs of semiconductor diode laser pumped Nd:YAG crystals can amplify the free space output of a semiconductor diode laser seed.

In accordance with this invention, semiconductor diode lasers 10 operating as current or voltage controlled oscillators may include distributed feedback (DFB) semiconductor lasers (DFB-SL), DFB-MOPAs, distributed Bragg reflector (DBR) lasers, or external cavity lasers (ECL), all of which can be frequency modulated by varying the drive current injected into the semiconductor laser gain medium. FIG. 6 illustrates a range of FM modulation responses as a function of current for typical semiconductor lasers. Monolithic semiconductor lasers typically exhibit a CCO gain of 0.1 to 10 GHz/mA while external cavity semiconductor lasers exhibit a reduced CCO gain of 1 to 100 MHz/mA. In the case of semiconductor DFB lasers, their FM tuning response can exhibit a thermal crossover frequency at which their FM tuning response transitions from red-shifted to blue-shifted. This non-ideal tuning characteristic can have undesirable stability effects on the control circuit if the bandwidth is increased significantly above the thermal crossover, so it is advantageous to utilize DFB lasers with linewidths a small fraction of the thermal crossover frequency to provide adequate phase noise suppression within the available locking bandwidth.

In general, the bandwidth requirements of the optical phase-locked loop are about an order of magnitude larger than the laser free-running linewidth. Monolithic semiconductor lasers typically exhibit a linewidth of 0.5 to 5 MHz and external cavity semiconductor lasers typically exhibit a linewidth of 1 to 500 KHz. Semiconductor lasers are available in a wide range of wavelengths to seed fiber amplifiers in the vicinity of 1 micron, 1.3 micron and 1.5-1.6 micron.

The reference laser is advantageously a highly stable, narrow linewidth source producing >1-10 mW. The spectral and phase-noise characteristics of the high power, coherently combined laser system closely duplicate the characteristics of the reference laser because the electronic control circuits force the local lasers to track the frequency and phase of the shared reference laser. For example, the reference laser may be an external cavity semiconductor diode laser with a linewidth of 10 KHz or a fiber laser with a linewidth of 10's of Hz.

Example

Diode Laser Sideband Locking

Many semiconductor laser devices can not be effectively phase-locked by traditional methods because their linewidths are not substantially less than their flat phase FM modulation bandwidth. Typical flat-phase FM modulation bandwidths extend from dc to 1 MHz and are based upon the thermal tuning mechanism, for which the laser frequency red shifts (i.e., wavelength increases) as the current increases. To overcome this limitation, we disclose herein a system to lock the laser diode sideband rather than the carrier, thereby driving the laser at a higher modulation frequencies (i.e., GHz) about which the FM response is substantially flat-phase.

In this example, an FM sideband of an FM modulated semiconductor laser diode serving as a local oscillator is phase-locked to the carrier of the reference laser oscillator (Note that in general, the reference laser may also have sidebands to which this semiconductor laser diode may be locked). The optical power in an FM sideband of the local oscillator (LO) may be locked to the reference oscillator (RO) with low relative phase error. The current control signal required to lock such a sideband is a relatively narrow bandwidth signal (e.g., 10-100 MHz) centered on an offset frequency (in the range of 500 MHz to 5 GHz, for example). Sideband locking thereby utilizes only the high-speed plasma or electronic tuning mechanism, avoiding the thermal tuning response that typically exhibits an undesirable frequency crossover point (in the 0.1 to 10 MHz frequency range).

Figure 7:
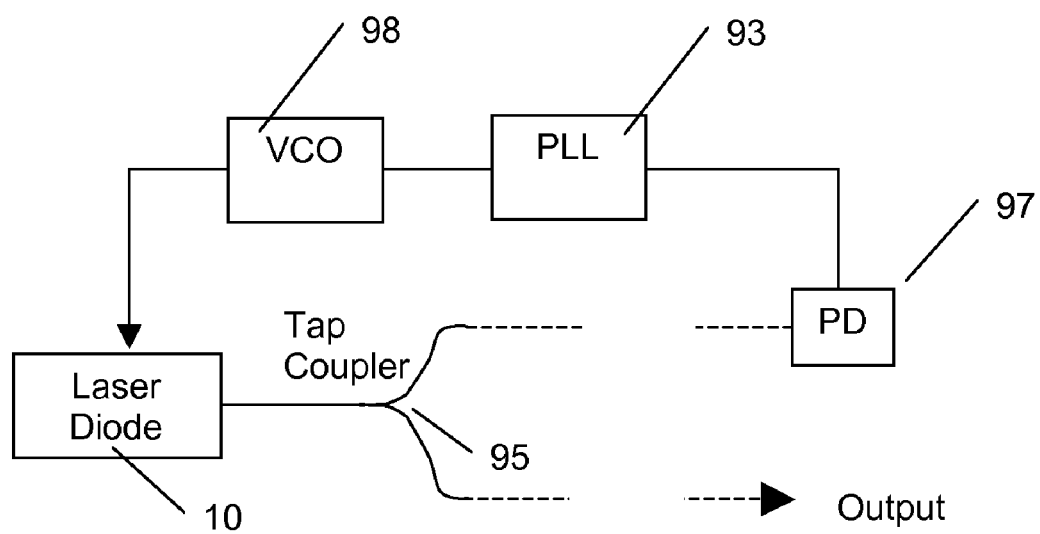
FIG. 7 illustrates a block diagram of an optical phase-locked loop for locking a diode laser's sideband.

In the standard optical phase-locked loop implementation, a base-band control signal is directly injected into diode laser gain section to control the frequency of the diode laser. In contrast, in this sideband locking implementation, the phase-locked loop 93 produces an electronic feedback signal that drives an electronic VCO 98 preceding the laser diode 10 (FIG. 7). The VCO operates at a nominal RF frequency well above the thermal crossover frequency.

The input to the phase-locked loop 93 is a signal corresponding to the optical phase of the laser diode 10. Such an input signal may be produced by a square law photodetector 97, which is responsive to an optical beat signal derived from the laser diode 10, for example. The feedback signal thereby modulates the frequency of the RF offset signal. This FM modulated signal, with a bandwidth of 100 MHz centered on 1 GHz, for example, is injected into the laser diode 10 gain section to produce a sideband whose optical phase excursions are locked to that of a reference source. The reference source may also be laser diode 10 or a reference laser.

For a modulation index of 2, the first sideband power is maximized and equal to approximately 25% of the original carrier power. To increase the fraction of power in the first sideband, single-sideband suppressed-carrier type modulation may be generated. There are several techniques to generate a single sideband, including bandpass filtering, Hartley modulators or Weaver modulators. Bandpass filtering utilizes optical filters to attenuate unused sidebands and thereby produce a pure optical tone. Such optical filtering is accomplished by the use of fiber Bragg gratings, diffraction gratings, etalons, or thin-film filters, for example. The center frequency of the locked laser can also be electronically tuned without impacting phase-locking. In this case, a tunable optical bandpass filter is utilized to retain only the single sideband.

Figure 8:
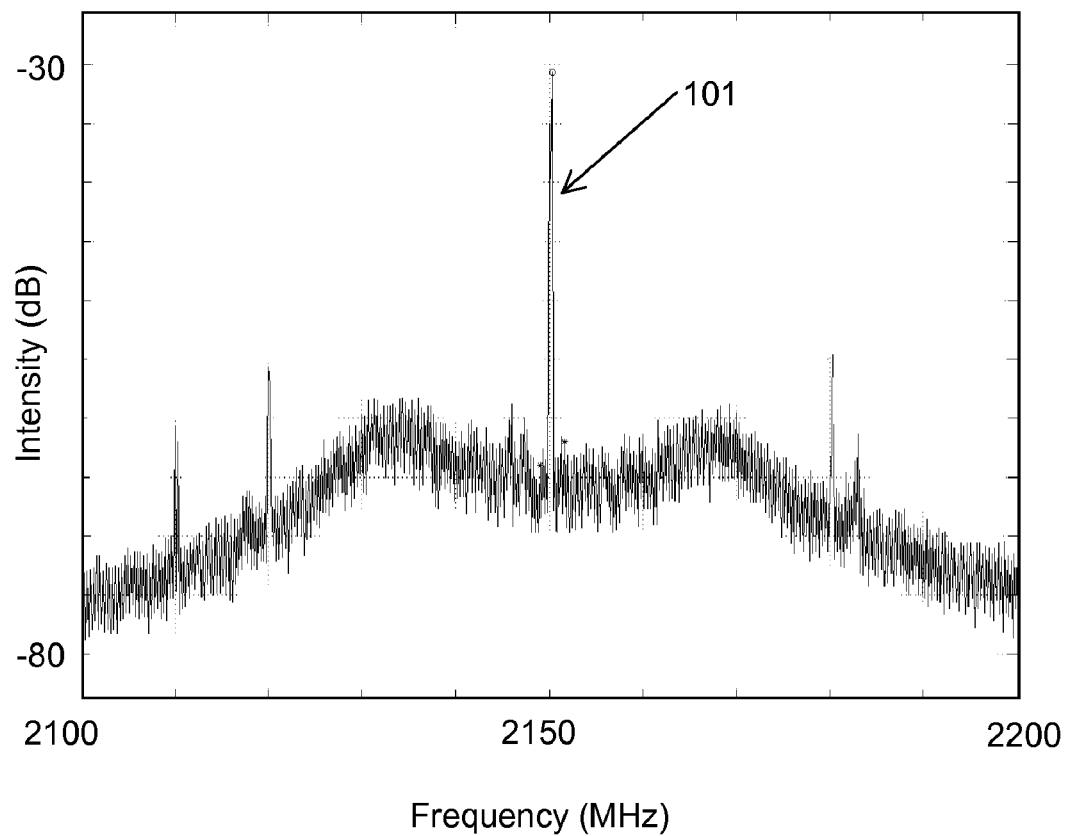
FIG. 8 illustrates the measured RF spectrum of a phase-locked beat note between a diode laser sideband and a reference laser.

A measured RF spectrum of the locked beat note 101 between the LO+1 sideband and RO for a commercially available DFB-LO at 1550 nm is illustrated in FIG. 8. The ratio of crossover frequency (~1 MHz) to spectral linewidth (~5 MHz) for this laser was inadequate to achieve phase-locking at the carrier frequency. However, by locking to the sideband, the OPLL bandwidth (~50 MHz) was no longer limited by the thermal FM response bandwidth and the crossover behavior was avoided. Sideband locking enables loop bandwidths to be significantly increased to greater than 10× the laser linewidth, thereby ensuring low rms residual phase error under locked conditions.

In a particular application of sideband locking, a diode laser is sideband locked to a frequency discriminator which provides an electrical signal proportional to the laser frequency. By stabilizing the laser's frequency (and therefore phase) excursions, the laser's emission linewidth is narrowed.

Figure 9:
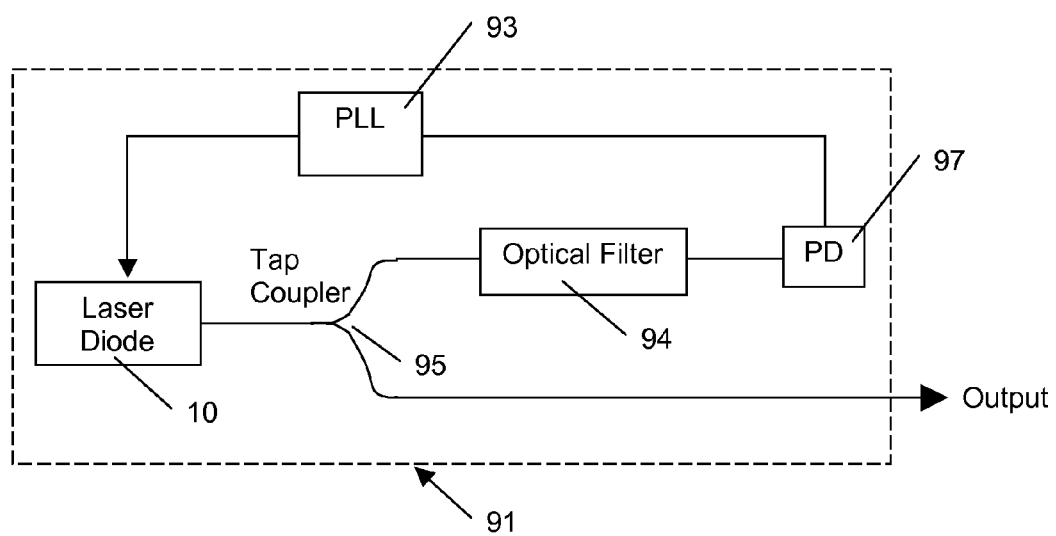
FIG. 9 illustrates a block diagram of an opto-electronic system for linewidth narrowing of diode lasers.

An electronically linewidth narrowed diode laser system 91 is illustrated schematically in FIG. 9. The phase noise level of a semiconductor laser emitter 10 within such a control system is suppressed within the electronic bandwidth of the phase-locked loop 93. To accomplish linewidth reduction, a small fraction of the laser's output power is extracted, using tap coupler 95, and launched into an optical filter or frequency discriminator 94 followed by a photodetector 97. The frequency discriminator 94 consists of, for example, a Mach-Zehnder interferometer with different delays in its two arms and is implemented using fused fiber couplers or bulk optic beamsplitters. A typical free spectral range of such an interferometer is 1 MHz to 1 GHz, selected to be greater than the combined frequency excursion due to the laser's frequency jitter and spectral linewidth. Alternately, a frequency selective etalon consisting of two partially reflective, plane parallel surfaces may be used. In either case, the discriminator produces an optical output whose amplitude is approximately linearly related to frequency. The detection of this signal thereby provides an electronic error signal, with amplitude proportional to frequency variation, which can be used by the optical phase-locked loop to stabilize the frequency of diode laser 10. Multiple stages of linewidth reduction may be accomplished by utilizing an arrangement of coarse and fine resolution optical filters with different free spectral ranges and separate feedback loops.

Typical free-running diode lasers 10 exhibit a linewidth of 1 to 10's of MHz. The use of sideband locking can reduce the linewidth by several orders of magnitude. In a particular example, laser emitters 10 are DFB (distributed feedback) lasers emitting 1 to 1000 mW at visible or infrared wavelengths. The DFB laser may produce a free-space output or may be fiber-coupled. The laser gain section can generally be FM modulated at high speeds (<1 GHz) by direct current injection into the oscillator gain section. The phase-locked loop 93 control algorithim generates an appropriate current signal to substantially reduce the phase-noise of the laser to below its free-running linewidth.

Example

Ytterbium Fiber Amplifier

In a particular implementation, an amplifier 18 utilizes a Ytterbium doped silica optical fiber with a single mode core 20 microns and a secondary outer core of 100 microns for guiding the optical pump illumination longitudinally along the fiber until the pump illumination is absorbed by the Yb ions in the doped single mode core to provide optical gain in the wavelength range of 1055 nm to 1070 nm. The typical pump wavelength is 975 nm corresponding to the Yb absorption peak in silica glass. The amplifier output power is in the range of 35-500 W cw, requiring diode laser pump power of 70 to 1000 W. The optical power seeding each amplifier is advantageously between 1-100 mW with optical pre-amplifiers or 1-10 W without preamplifiers.

The wavelength of the seed laser is nominally 1064 nm with an input laser linewidth of <1 MHz. The amplifier's output is large mode area single mode fiber that is terminated in a free space collimator. The output beam quality, characterized by the beam quality metric $M^2$, is between 1.0-1.25. The wall plug efficiency of the pump diodes is 50 to 80% and the diodes may be single high power emitters, bars of emitters or two-dimensional arrays of emitters. The multimode pump lasers are coupled to multimode optical fibers. The pump energy is coupled into a dual core Yb fiber by fused-tapered multimode pump combiners spliced to the outputs of each pump diode. The amplified laser system is electrically efficient, exhibiting a net wall plug efficiency >30%. The optical intensity within the amplifier is kept sufficiently below the SBS intensity threshold such that the linewidth remains narrow (<10 KHz) even upon amplification.

The power level at which Yb amplifiers 18 begin to experience non-linearities can be increased further by frequency modulating the laser 10 and distributing the laser power over one or more sidebands. The frequency spacing of the sidebands should be larger than the SBS gain peak width (about 100 MHz). The optical powers in the fundamental and multiplicity of sidebands should then individually lie below the SBS threshold power. By direct modulation of the drive current of the semiconductor diode laser 10 seeding the amplifier, FM sidebands are produced without the need for external phase modulators or frequency shifters.

Example

Erbium Fiber Amplifier

For many applications it is advantageous for the high power laser source to emit at eye-safe wavelengths such as 1550 nm. For example, an amplifier 18 exhibiting optical gain in the wavelength range of 1520 nm to 1610 nm utilizes a Er-doped silica optical fiber with a single mode core and a secondary outer core for guiding the optical pump illumination that is absorbed by the Erbium ions in the single mode core. The typical pump wavelength is 980 nm and/or 1480 nm. The amplifier output power is typically in the range of 100 W cw, requiring pump power of 300 to 500 W.

The wavelength of the seed laser is nominally 1550 nm with an input laser linewidth of <1 MHz. The output fiber is single mode and terminated in a free space collimator. The output beam quality, characterized by the beam quality metric $M^2$, is less than 1.25. The wall plug efficiency of the 980 nm pump diodes is >50%. The multimode pump lasers are coupled to multimode optical fibers, which are launched into the dual core Erbium fiber by use of fused, tapered fiber pump combiners.

Example

10 KW Coherently Combined Laser

In a further example, a total of 32 single stage power amplifiers, each 340 W and single mode, single polarization and single frequency, are seeded by 32 fiber coupled master-oscillator power-amplifier (MOPA) DFB lasers producing 1-10 W at 1064 nm or 1550 nm. The MOPA-DFB lasers include a DFB section of 10-100 mW power and an on-chip tapered semiconductor amplifier to increase the power to 1-10 W. The collimated output beams are aligned with high parallelism and overlap to provide high coherent combining efficiency with good beam quality. Each collimator is mounted in a carrier providing adjustable tip-tilt angles to achieve the beam alignment criteria set forth above. The amplifier outputs are combined by a binary tree arrangement of free space beam splitters with high power handling capability.

Each of the MOPA-DFB lasers is electronically frequency and phase-locked to a common reference laser in an independent fashion. To accomplish this, each output of an array of MOPA-DFB laser diodes is tapped by an asymmetric fused splitter (e.g., 1/99 or 5/95), and the low power tap output is optically mixed with the reference laser on a fast photodetector by combining the two lasers with a 50/50 fused coupler. The interference signal generated by the photodetector is input into the electronic phase-locked loop to derive a control signal which locks the MOPA-DFB laser to the reference laser with a potentially non-zero fixed frequency offset and a programmable phase offset. The frequency locked outputs of the laser diodes are each amplified by a fiber-coupled amplifier that adds little or no high frequency (>10 MHz) phase noise. The collimated outputs of the amplifiers are hexagonally packed to launch a substantially aperture filled beam into free space. A portion of the combined output beam is picked-off and interfered with the reference laser beam on an array of photodetectors. This beat signal allows the relative phase noise created by the Ytterbium or Erbium fiber amplifiers to be eliminated by the optical phase-locked loop.

Example

100 KW Coherently Combined Laser

In an alternate example, a multiplicity (e.g., 217) of phase-locked laser diodes 10 are used to seed an equivalent number of 500 W, single mode, single polarization, single frequency amplifiers 18. The amplifier outputs are combined by a hexagonally packed free space beam expander/collimator with eight concentric layers for the case of 217 laser-amplifier elements. To produce a near-diffraction limited beam with low beam divergence, the areal fill factor must be increased above 50%. This fill factor can be increased by utilizing a microlens array fabricated of glass, crystal or polymer, or a lens/diffractive beam combiner combination fabricated of glass and/or polymer.

Example

1 MW Coherently and Spectrally Combined Laser

In an alternate example, ten high power laser modules, each producing 100 KW at 10 unique wavelengths, are spectrally combined. The module consists, for example, of an array of 217 phase-locked laser diodes 10, which are used to seed 500 W, single mode, single polarization, single frequency amplifiers 18. Each module is spaced in wavelength by 1 to 0.01 nm and combined by a free space wavelength beam combiner utilizing dielectric thin film filters, volume Bragg gratings, unbalanced interferometers/interleavers or planar diffraction gratings.

In conclusion, the semiconductor laser phase-locking techniques herein provide several advantages, including the realization of various high power, electronically phase-locked laser systems with improved scaleability, reduced complexity and improved performance, as well as electronic linewidth narrowing of laser diodes. These applications are the consequence of the techniques disclosed herein to phase-lock a wide-range of commercially available semiconductor laser diodes with low residual phase error. Those skilled in the art will readily observe that numerous modifications and alterations of the system may be made while retaining the teachings of the invention.

What is claimed is:

1. A coherent laser system with enhanced optical power comprised of:
   a single reference emitter producing a reference beam at an optical frequency $f_1$;
   a multiplicity of tunable optical emitters producing a corresponding number of seed beams, each at an optical frequency $f_n$ changeable by an electrical drive signal;
   a multiplicity of optical amplifiers producing a corresponding number of amplified beams;
   a multiplicity of high-speed photodetectors;
   a multiplicity of low-speed photodetectors;
   a multiplicity of electronic feedback circuits generating electrical control signals;
   whereby the tunable optical emitters and reference emitter are arranged such that each seed beam interferes with a portion of the reference beam to produce an optical beat signal at a frequency $f_n$-$f_1$ on the high-speed photodetector, wherein the high-speed photodetector transforms the optical beat signal into a high-bandwidth intermediate electrical signal which is input to the electronic feedback circuit, this circuit generating the electrical drive signal which maintains the tunable optical emitter at the precise optical frequency $f_n$, wherein the tunable optical emitter is followed in a series arrangement by an optical amplifier that increases the optical power of the tunable optical emitter, which is then followed by a low-speed photodetector that produces a low bandwidth intermediate electrical signal which is based on the pair wise interference characteristics between amplified beams, this low-bandwidth intermediate electrical signal input to the same electronic feedback circuit to generate the electrical drive signal sufficient to maintain the tunable optical emitter at the precise phase required for efficient coherent power addition of the multiplicity of amplified beams.

2. A coherent laser system in accordance with claim 1, wherein the optical amplifiers are fiber amplifiers utilizing erbium, praseodymium and/or ytterbium doped active fiber pumped by semiconductor diode lasers.

3. A coherent laser system in accordance with claim 1, wherein the optical amplifiers are Raman fiber amplifiers.

4. A coherent laser system in accordance with claim 1, wherein the high-speed photodetectors have an electronic bandwidth in excess of 1 GHz and the low-speed photodetectors have an electronic bandwidth of 1 MHz or less.

5. A coherent laser system in accordance with claim 1, wherein the tunable optical emitters are single frequency, DFB semiconductor diode lasers emitting in the 1.0-1.7 micron wavelength range with a drive signal tuning response of 0.1 to 10 GHz per mA.

6. A coherent laser system in accordance with claim 1, wherein the electronic feedback circuit includes an electronic voltage controlled oscillator that generates a changeable frequency offset in the range of 0.1 to 100 GHz.

7. A system in accordance with claim 6, wherein the frequency offset is identically equal to $f_n$-$f_1$.

* * * * *